United States Patent [19]

Haferl

[11] Patent Number: 4,484,113
[45] Date of Patent: Nov. 20, 1984

[54] REGULATED DEFLECTION CIRCUIT

[75] Inventor: Peter E. Haferl, Adliswil, Switzerland

[73] Assignee: RCA Corporation, New York, N.Y.

[21] Appl. No.: 333,610

[22] Filed: Dec. 22, 1981

[30] Foreign Application Priority Data

Feb. 16, 1981 [GB] United Kingdom ............... 8104750

[51] Int. Cl.³ ...................... H01J 29/70; H01J 29/76
[52] U.S. Cl. .................................. 315/408; 315/411
[58] Field of Search ............. 315/411, 408, 399, 397; 358/190; 363/19, 21, 31, 34; 361/152

[56] References Cited

U.S. PATENT DOCUMENTS

| 3,198,978 | 8/1965 | Taylor, Jr. | 315/27 |
| 3,596,165 | 7/1971 | Andrews | 321/2 |
| 3,936,115 | 2/1976 | Dietz | 315/399 |
| 3,967,182 | 6/1976 | Scott | 321/18 |
| 3,999,102 | 12/1976 | Gent et al. | 315/410 |
| 4,176,304 | 11/1979 | Scott | 315/411 |
| 4,193,018 | 3/1980 | Dietz | 315/408 |
| 4,227,125 | 10/1980 | Bohringer | |
| 4,232,254 | 11/1980 | Haferl | 315/408 |
| 4,240,013 | 12/1980 | Wedam | 315/411 |
| 4,242,714 | 12/1980 | Yoshida et al. | 361/152 |
| 4,245,180 | 1/1981 | Rilly et al. | 315/411 |
| 4,253,136 | 2/1981 | Nanko | 363/21 |
| 4,276,586 | 6/1981 | Boekhorst | 363/21 |
| 4,291,367 | 9/1981 | Haas | 363/21 |

FOREIGN PATENT DOCUMENTS

| 2446557 | 8/1980 | France. |
| 2002984A | 2/1979 | United Kingdom. |
| 2029989A | 3/1980 | United Kingdom. |
| 2042834A | 9/1980 | United Kingdom. |

Primary Examiner—Theodore M. Blum
Assistant Examiner—Gregory C. Issing
Attorney, Agent, or Firm—Eugene M. Whitacre; Paul J. Rasmussen; Joseph J. Laks

[57] ABSTRACT

A deflection generator of a television receiver is coupled to a deflection winding for generating scanning current during a deflection cycle. The generator includes a retrace capacitor coupled to the deflection winding for forming a retrace resonant circuit therewith to produce a retrace pulse voltage during a retrace interval of the deflection cycle. An inductor and another capacitor form a second resonant circuit that is coupled to the retrace resonant circuit. A switching arrangement is coupled to a source of energy and the second resonant circuit in a push-pull configuration. The switching arrangement is responsive to a deflection rate switching signal to store during trace a controllable amount of energy from the source in the second resonant circuit. This stored energy is then transferred to the retrace resonant circuit during the retrace interval to replenish losses sustained during the deflection cycle.

35 Claims, 17 Drawing Figures

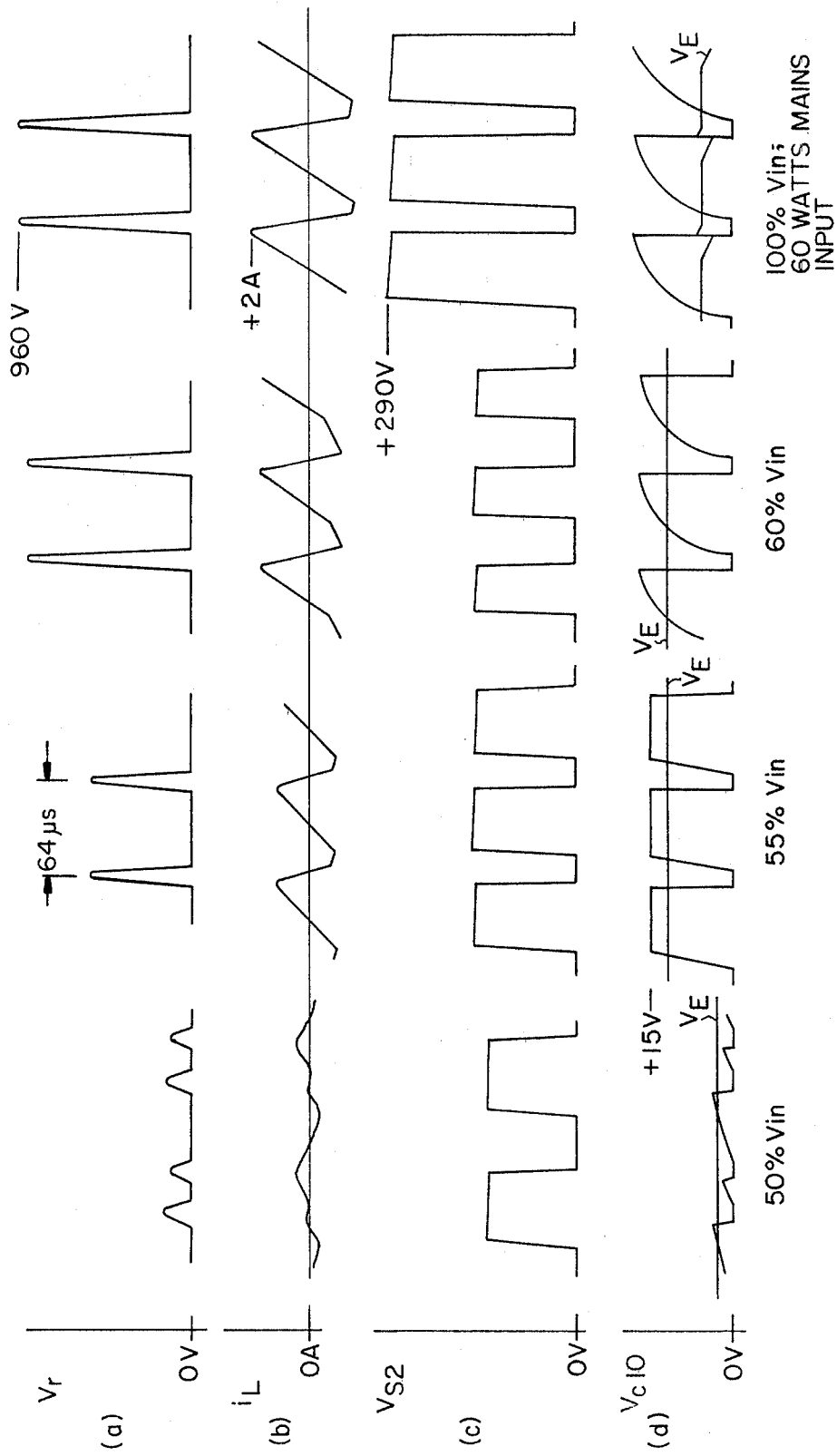

REGULATED DEFLECTION CIRCUIT

This invention relates to regulated deflection circuits for television display systems.

Known AC power line or mains isolated television receivers show a variety of design approaches for the power supply circuitry. In one design, a 50 or 60 cycle mains transformer may be used to provide electrical isolation. The mains transformer, however, is relatively heavy and bulky. The magnetic stray field produced by the transformer may introduce purity registration errors in a color television receiver. Furthermore, since the mains transformer provides only electrical isolation, additional voltage regulation circuitry may be needed.

A switched mode power supply may be used in large screen television receivers. Such a power supply is relatively costly and requires special components such as the switched mode transformer, switching transistor and rectifier diodes. The control circuit may include overload and short circuit protection and therefore be complicated and difficult to service and prone to increased failure rates. Where the high voltage or flyback transformer is used for mains isolation in a synchronously switched type power supply, a complicated control circuit may be required as well as a separate power supply for television receiver start-up.

A feature of the invention is a switching power supply requiring no specialized components and using simplified control circuitry. The power supply provides intrinsic protection against overloads and short circuits and does not require a separate start-up transformer.

A deflection generator is coupled to a deflection winding for generating scanning current during a deflection cycle. The deflection generator includes a retrace capacitance coupled to the deflection winding for forming a retrace resonant circuit therewith to produce a retrace pulse voltage during a retrace interval of the deflection cycle. A second resonant circuit including an inductance is coupled to the retrace resonant circuit to enable energy to be transferred therebetween. A switching arrangement is coupled to a source of energy and to the second resonant circuit and is responsive to a deflection rate switching signal for storing a controllable amount of energy from the source in the second resonant circuit.

In one inventive aspect, the switching arrangement forms a self-oscillating arrangement with the second resonant circuit to produce free-running oscillation, in the absence of the deflection rate switching signal. Such an arrangement provides for soft-start operation and limited energy transfer during short-circuit conditions.

In another inventive aspect, the switching arrangement comprises first and second controllable switches coupled to the second resonant circuit. Each switch becomes conductive after the other switch has become nonconductive. The first switch when conductive couples the source of energy to the second resonant circuit to enable the transfer of energy therebetween. The first switch when nonconductive decouples the source from the second resonant circuit. The second switch when conductive enables the transfer of energy between the second resonant circuit and the retrace resonant circuit.

FIGS. 5–12 illustrate waveforms associated with the operation of the circuits of FIGS. 1a, 1b, 2a and 2b;

Figure 1A:
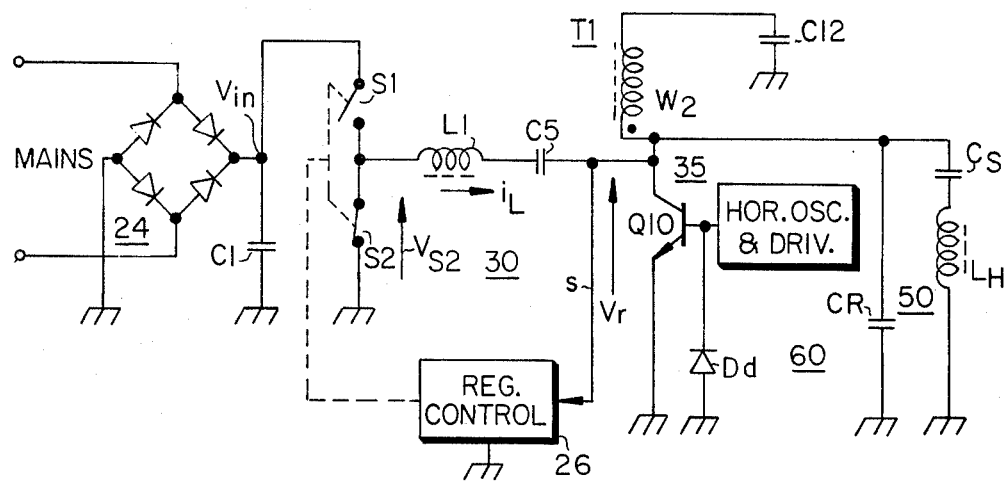
FIGS. 1a and 1b illustrate in simplified schematic form two embodiments of a regulated deflection circuit embodying the invention.

In the Drawing figures, the convention chosen for the direction of the voltage arrow between two terminals is such that the negative terminal is considered the reference terminal nearest which the tail of the arrow is located.

Figure 1B:
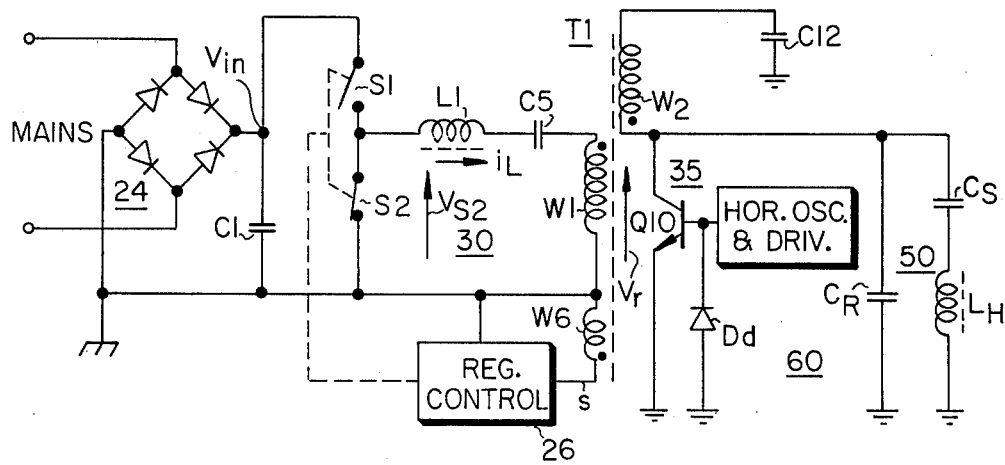

FIGS. 1a and 1b illustrate in simplified schematic form a regulated television receiver deflection circuit and power supply embodying the invention. FIG. 1a illustrates a version not conductively isolated from the AC power mains source and FIG. 1b illustrates an isolated version. Switching devices S1 and S2 form a blocking oscillator arrangement 30 with an inductor L1 and a capacitor C5. The conduction of both switches is controlled by a positive feedback signal, not illustrated in FIGS. 1a and 1b, derived from the voltage developed across inductor L1 and provided to a regulator control circuit 26. Included in FIGS. 1a and 1b are the mains supply rectifier 24 with its filter capacitor C1, the horizontal deflection circuit 60, and the flyback transformer T1. Not illustrated in FIGS. 1a and 1b are the various load circuits of the television receiver that are coupled to windings of the flyback transformer.

To describe the free-running operation of blocking oscillator 30 of FIG. 1a, for example, assume horizontal trace switch 35 of horizontal deflection circuit 60 is shortcircuited to ground. Blocking oscillator 30 will free-run at a frequency determined by the values of L1 and C5. This frequency may be chosen about 2 or more times lower than the horizontal deflection frequency, $f_H$. The free-running frequency is selected lower than the horizontal deflection frequency in order to permit proper synchronization of blocking oscillator operation with horizontal scanning current generation when the blocking oscillator operates in the deflection synchronized mode. However, if the free-running frequency is selected too low, unnecessarily high peak currents in inductor L1 are developed during free-running operation.

The choice of the L to C ratio of inductor L1 and capacitor C5 determines the peak input current or inductor current $i_L$ that will flow during free-running operation and therefore determines the maximum available power that can be consumed. Free-running operation also occurs in case of a short-circuited load being produced across any of the windings of flyback transformer T1.

Figure 5:
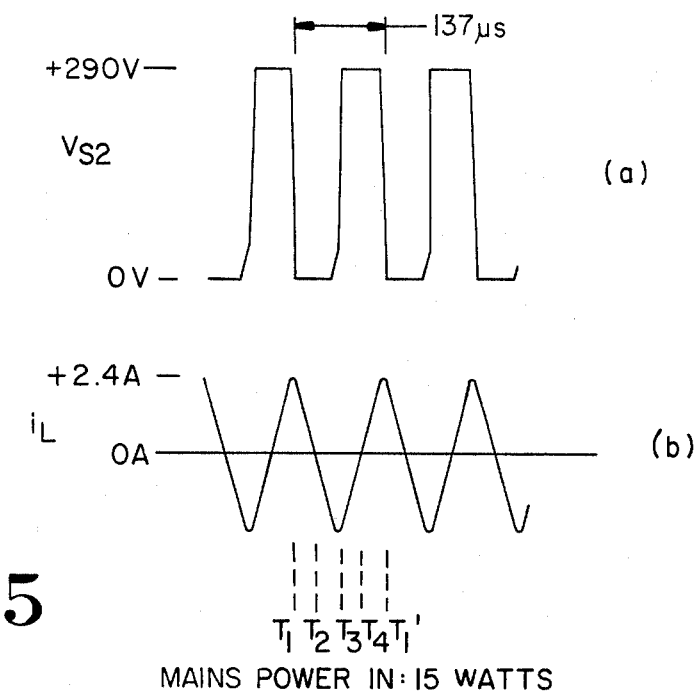

The switching voltage $V_{S2}$ across switch S2 and the inductor current $i_L$ flowing during free-running operation is illustrated in FIGS. 5a and 5b. The voltage switching waveform across switch S1, not illustrated, is 180° out of phase with the waveform of FIG. 5a. Most of the power flowing through the two switches is reactive in nature and, thus, the actual power consumption is very low. The power consumption equals the losses in switches S1 and S2 and in the resistive components of inductor L1 and capacitor C5.

To describe synchronized oscillator operation, assume that horizontal output transistor Q10 of FIG. 1a is being switched at a horizontal rate to generate scanning current in horizontal deflection winding $L_H$ and that a retrace pulse voltage $V_r$, illustrated in FIG. 6a, is being generated at the collector electrode of output transistor Q10. From time $t_2$ within the horizontal trace interval of FIGS. 6a–6c to the later time $t_0$, the beginning of the next horizontal retrace interval, switch S2 is open and switch S1 is closed. The inductor current $i_L$ flows through switch S1, inductor L1, capacitor C5 and trace switch 35 to ground. At time $t_0$, the energy, $I_{p1}^2 L/2$, is stored in inductor L1 where L is the inductance of inductor L1 and $I_{p1}$ is the peak current flowing in inductor L1 at time $t_0$.

At time $t_0$ of FIGS. 6a–6c, horizontal output transistor Q10 opens. The developed retrace pulse voltage $V_r$ is applied to regulator control circuit 26 along a signal line s to synchronize the opening of switch S1 and closing of switch S2 with the beginning of horizontal retrace. With switch S2 closed between times $t_0$–$t_2$, the current path for the inductor current $i_L$ is now connected to the retrace resonant circuit 50, comprising retrace capacitor $C_R$, S-shaping capacitor $C_S$ and horizontal deflection winding $L_H$. As a result, the energy stored in inductor L1 at time $t_0$ transfers rapidly into the retrace resonant circuit 50, as illustrated by the rapidly decreasing current $i_L$ after time $t_0$ in FIG. 6c. The current $i_L$ decreases rapidly, and when it reaches zero, all the energy stored in inductor L1 has been transferred. Subsequent to the zero-crossover instant of the inductor current $i_L$ during retrace, a small portion of the transferred energy returns to inductor L1 as indicated by the negative current $i_L$ prior to time $t_1$. At time $t_1$, the end of the horizontal retrace interval, damper diode $D_d$ and the base-collector junction of output transistor Q10 become forward biased, again effectively coupling capacitor C5 to ground. The energy transferred during each horizontal deflection cycle is substantially the difference between the energies stored in inductor L1 at times $t_0$ and $t_1$.

Between times $t_1$ and $t_2$, the current $i_L$ circulates through switch S2, inductor L1, capacitor C5 and the now closed trace switch 35. During this interval, energy stored in capacitor C5 discharges back into inductor L1. At time $t_2$, regulator control circuit 26 opens switch S2 and closes switch S1. The stored energy in inductor L1 now transfers back into the main filter capacitor C1 until the zero-crossover instant $t_3$ of the inductor current $i_L$. From time $t_3$ until the beginning of the next retrace interval, energy is again stored in indcutor L1 for subsequent transferral to retrace resonant circuit 50 and to the load circuits coupled to the various windings of flyback transformer T1.

The righthand side waveforms of FIGS. 6a–6c illustrate deflection synchronized operation of blocking oscillator 30 at a lower loading level by the load circuits coupled to the various windings of flyback transformer T1 when compared to the loading level illustrative of the lefthand side waveforms. The regulation action is to maintain the peak amplitude of retrace pulse $V_r$ constant. At the lower loading level, in contrast to the previously described situation, more energy has returned to inductor L1 at the end of the horizontal retrace interval, at time $t_1'$, and more energy is to be returned to the mains filter capacitor C1 from time $t_2'$ as a result of the lower consumption by the television receiver load circuits.

It should be noted that the energies stored in inductor L1 at time $t_0$ of the lefthand side waveforms of FIGS. 6a–6c and at time $t_0'$ of the righthand side waveforms are substantially equal, independent of the degree of loading. The peak stored energy depends only upon the rectified mains voltage amplitude. The maximum power than can be transferred by blocking oscillator 30 is therefore limited. At maximum loading or during short-circuit load operation, the average voltage across capacitor C5 is approximately half the magnitude of the input voltage Vin. With decreasing load, the average voltage across capacitor C5 increases.

The operation of the circuit of FIG. 1b is similar to that of the operation of the circuit of FIG. 1a because electrically they are substantially equivalent, due to the tight coupling between windings W1 and W2 of transformer T1 in FIG. 1b. A winding W6 of flyback transformer T1 develops the retrace pulse voltage that is applied to regulator control circuit 26 along signal line s.

Figure 2A:
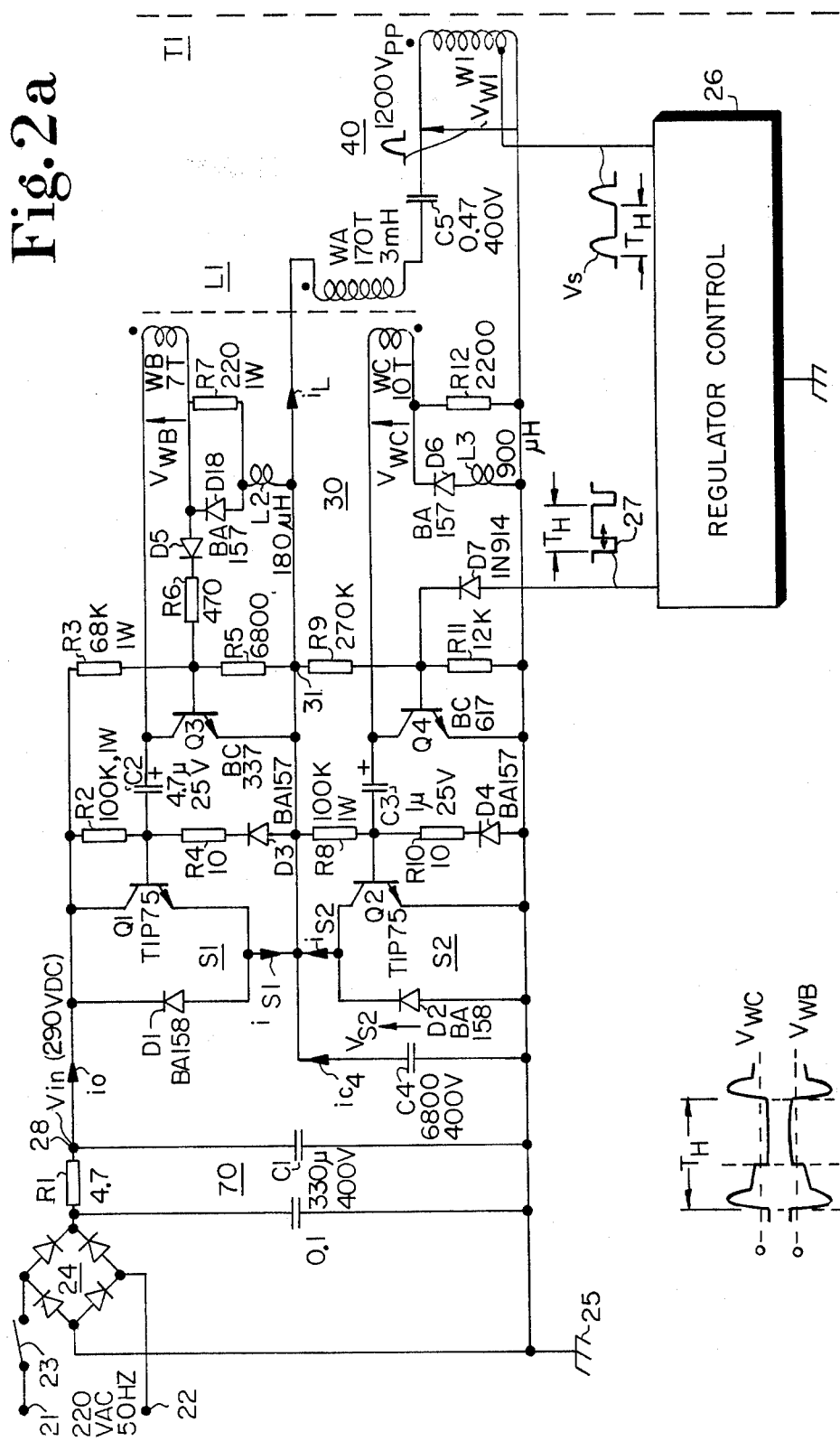
FIGS. 2a and 2b illustrate a detailed embodiment of a regulated deflection circuit embodying the invention.
Figure 2B:
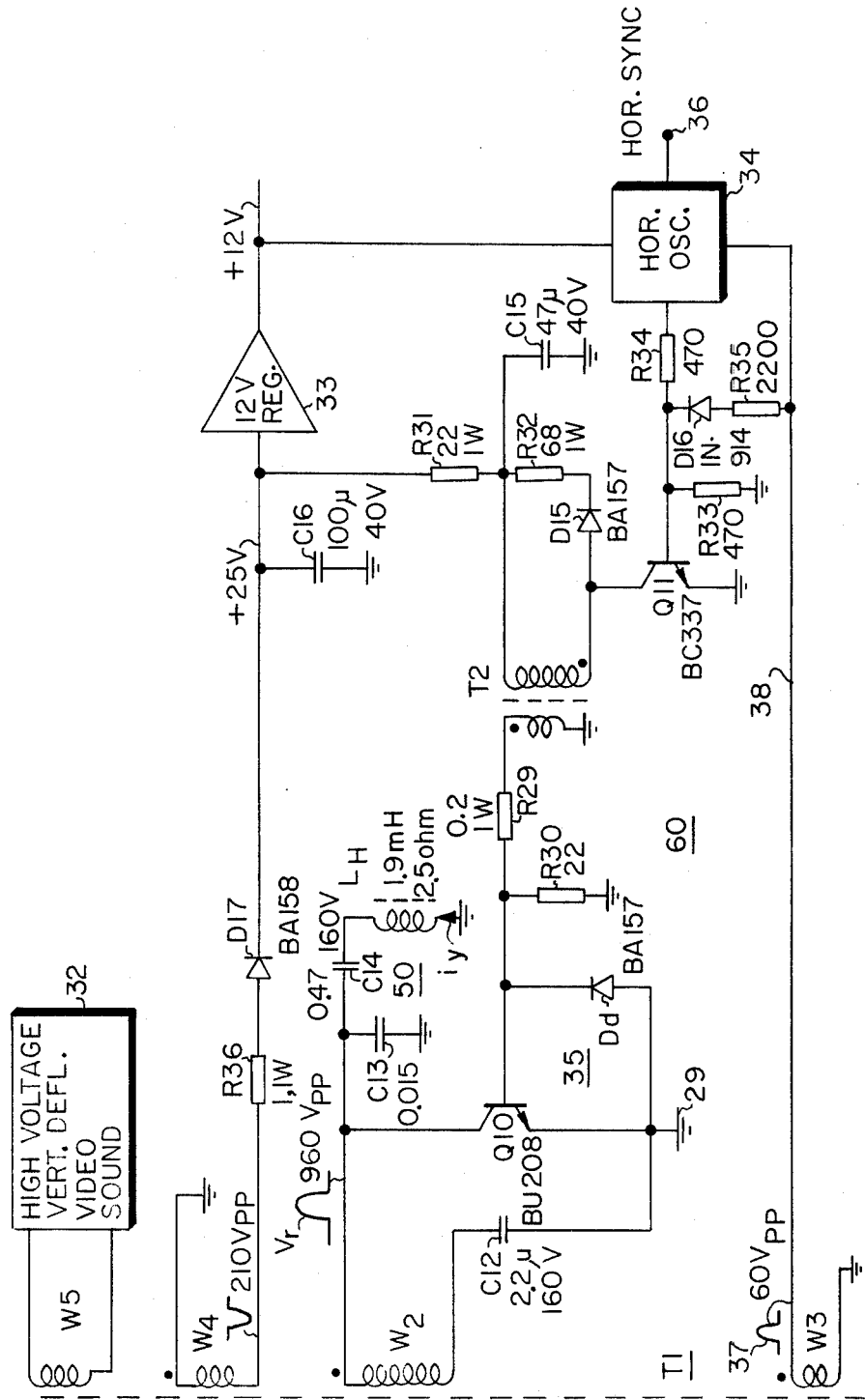

FIGS. 2a and 2b illustrate a detailed embodiment of a regulated television receiver deflection circuit embodying the invention. A 220 VAC, 50 Hz, power line or mains supply voltage is applied across terminals 21 and 22, full-wave rectified by rectifier 24, and filtered by a capacitor C1, to develop an unregulated direct input voltage Vin, of illustratively 290 volts, at a terminal 28. A television receiver on/off switch 23 is coupled between terminal 21 and an input terminal of bridge rectifier 24. The current return terminal of the bridge rectifier is coupled to an earth ground 25, not conductively isolated from the mains supply terminals 21 and 22. A current limiting resistor R1 is connected between the output terminal of bridge rectifier 24 and input terminal 28.

Unregulated input voltage Vin is applied to a blocking oscillator-regulator 30 that comprises the switching arrangement of controllable switches S1 and S2 coupled to a resonant circuit 40 in a push-pull relationship. Resonant circuit 40 is formed by the main winding WA of an inductor L1 and a capacitor C5. Switch S1 comprises a transistor Q1 and a damper diode D1 coupled between the collector and emitter electrodes of the transistor. Switch S2 comprises a transistor Q2 and a damper diode D2 coupled between the collector and emitter electrodes of transistor Q2. The main current paths of switches S1 and S2 are therefore bidirectionally conductive and coupled in series across the source of input voltage between terminals 28 and 25. The main current paths of switches S1 and S2 are also coupled to resonant circuit 40 at a common output junction terminal 31 of the switches S1 and S2 and the main winding WA of inductor L1.

In FIG. 2b, horizontal deflection generator 60 includes a horizontal deflection winding $L_H$ coupled in series with an S-shaping or trace capacitor C14 across a trace switch 35. Trace switch 35 comprises a horizontal output transistor Q10 and a damper diode $D_d$, with the emitter electrode of transistor Q10 being coupled to a chassis ground 29 that is conductively isolated from earth ground 25. A retrace capacitor C13 is coupled to deflection winding $L_H$ and forms a retrace resonant circuit 50 therewith when trace switch 35 is nonconductive.

A horizontal oscillator 34 applies a rectangular wave switching voltage, not illustrated in FIG. 2b, to the base of a driver transistor Q11 through a resistor R34 of a voltage divider comprising resistor R34 and a resistor R33. A horizontal rate switching signal is developed by driver transistor Q11 and coupled by way of driver transformer T2 to horizontal output transistor Q10, with the secondary winding of driver transformer T2 being coupled to the base of transistor Q10 through a resistor R29 of a voltage divider comprising resistor R29 and a resistor R30. Collector supply voltage for driver transistor Q11 is obtained from a +25 volt rail through a resistor R31 and the primary winding of transformer T2. A capacitor C15 is coupled to the junction of resistor R31 and the primary winding of transformer T2. A base current shaper network comprising a diode D15 and a resistor R32 is coupled across the primary winding of transformer T2.

Prior to the middle of the trace interval within a horizontal deflection cycle, driver transistor Q11 is turned off, resulting in a forward biasing voltage being applied to horizontal output transistor Q10. Immediately prior to the end of the horizontal trace interval, driver transistor Q11 is turned on, resulting in a reverse biasing voltage being applied to horizontal output transistor Q10. Shortly thereafter, collector current in output transistor Q10 ceases, thereby initiating the horizontal retrace interval. A retrace pulse voltage $V_r$ is developed across retrace capacitor C13 during the retrace interval.

The retrace pulse voltage $V_r$ of FIG. 2b is applied to a winding W2 of a flyback transformer T1 to develop retrace pulse voltages across windings W3–W5 of flyback transformer T1. A DC blocking capacitor C12 is coupled between flyback transformer winding W2 and isolated chassis ground 29.

To synchronize operation of horizontal deflection generator 60 with the picture content of the composite video signals of the television receiver, a retrace pulse 37 developed by flyback transformer winding W3 is applied to horizontal oscillator 34 along a conductor line 38, and a horizontal sync pulse, not illustrated, is applied to the oscillator at a terminal 36. A 12 volt supply voltage for horizontal oscillator 34 is provided by a regulator 33 from the voltage developed on the +25 volt supply rail.

The source of voltage for the +25 volt supply rail is obtained from the trace portion of the voltage developed across flyback transformer winding W4, as rectified by a diode D17 and filtered by a capacitor C16. A resistor R36 provides current limiting. Supply voltages for other television receiver circuits 32 such as the vertical deflection, the video, the sound, and the ultor high voltage, are derived from the voltages developed across various other flyback transformer windings, collectively illustrated in FIG. 1b as the winding W5.

To replenish losses sustained in horizontal deflection generator 60 and in the various television receiver load circuits 32, a winding W1 of flyback transformer T1 is coupled to the blocking oscillator resonant circuit 40 and transfers energy during the horizontal retrace interval of each deflection cycle from resonant circuit 40 to the retrace resonant circuit 50 and to the television receiver load circuits 32 including the ultor high voltage load circuit.

Figure 6:
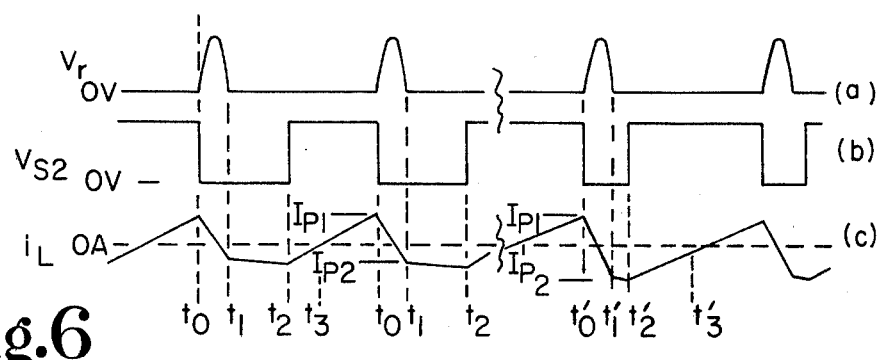

Assume, now, that blocking oscillator 30 is in the deflection synchronized mode of operation. As illustrated in FIG. 6, previously referred to with respect to operation of the simplified circuits of FIGS. 1a and 1b, during the trace interval of a horizontal deflection cycle, at a controllable instant $t_2$, S1 becomes conductive and S2 becomes nonconductive, connecting the source of unregulated voltage Vin to resonant circuit 40. The current $i_L$ flowing in the winding WA of inductor L1 begins to ramp upward. Between times $t_2$–$t_3$ when the inductor current $i_L$ is negative, energy is being returned to the source 70 of the input voltage Vin. After time $t_3$, the zero-crossover instant of the inductor current $i_L$, energy is transferred from input voltage source 70 to resonant circuit 40, principally to the magnetic field of inductor L1. At time $t_0$, the beginning of the horizontal retrace interval, $t_0$–$t_1$, the energy stored in the inductance of resonant circuit 40 is maximum.

At the beginning of the horizontal retrace interval, horizontal output transistor Q10 is made nonconductive, resulting in retrace resonant circuit 50 being coupled, via transformer T1, to resonant circuit 40. The energy stored in inductor L1 discharges rapidly therefrom and into retrace capacitor C13. During the horizontal retrace interval, with retrace capacitor C13 transformer coupled to resonant circuit 40, the resonant frequency of circuit 40 increases to produce the rapid discharge of energy in inductor L1.

The rising retrace voltage $V_r$ makes controllable switch S1 nonconductive to decouple the source of input voltage from resonant circuit 40. Shortly thereafter, controllable switch S2 becomes conductive, coupling inductor L1 and capacitor C5 in series across flyback transformer winding W1. As a result, the retrace pulse voltage $V_r$ is applied by way of flyback transformer windings W2 and W1 to resonant circuit 40. Energy is then transferred from resonant circuit 40 to retrace resonant circuit 50.

Between times $t_0$–$t_1$, the inductor current $i_L$ ramps downwardly, at a relatively rapid rate, until substantially all the energy of inductor L1 is transferred to retrace capacitor C13 at the zero-crossover instant of the current $i_L$ at some instant between times $t_0$–$t_1$. Between the zero-crossover instant and time $t_1$, the end of the horizontal retrace interval, a small portion of energy is returned to inductor L1 as indicated by the peak inductor current $I_{p2}$ at time $t_1$. This returning energy is required to keep the blocking oscillator 30 in operation. The energy transferred during each horizontal deflection cycle is substantially the difference between the energies stored in inductor L1 at times $t_0$ and $t_1$.

Between times $t_1$ and $t_2$, the current $i_L$ circulates through switch S2, inductor L1 and capacitor C5. During this interval, energy stored in capacitor C5 discharges into inductor L1. At time $t_2$, switch S2 becomes nonconductive and switch S1 becomes conductive. The stored energy in inductor L1 immediately after time $t_2$ begins to transfer back into the filter capacitor C1 of the unregulated source 70 of input voltage Vin until the zero-crossover instant $t_3$ of the inductor current $i_L$. From time $t_3$ until the beginning of the next retrace interval, energy is again stored in inductor L1 for subsequent transferral to the retrace resonant circuit 50. Retrace time modulation caused by variable loading is insignificant because blocking oscillator 30 appears as a current source to retrace resonant circuit 50 during the retrace interval.

To regulate a deflection circuit energy level, represented by the retrace pulse voltage $V_r$, a low voltage tap point on flyback transformer winding W1 is connected to regulator control circuit 26 to apply thereto a sample $V_s$ of the retrace pulse voltage $V_r$. The regulator control circuit 26 responds to variations in the voltage $V_s$ by pulse-width modulating the rectangular wave control voltage waveform 27 that is applied to blocking oscillator-regulator 30.

Regulation of the retrace pulse voltages $V_r$ and $V_s$ is obtained by changing the duty cycle of the blocking oscillator-regulator 30 by means of changing the turnoff instant $t_2$ of controllable switch S2. The turnoff instant of switch S1 is fixed within each deflection cycle near time $t_0$, just after the beginning of the horizontal retrace interval.

In FIG. 2a the control windings WB and WC of inductor L1 provide a positive feedback current for the switching transistors Q1 and Q2. The base currents are capacitively coupled via capacitors C2 and C3 so that the initial start-up base currents through resistors R2 and R8 do not become short-circuited by the control windings WB and WC. Capacitors C2 and C3 also provide negative cutoff voltages that are used to initiate the reverse biasing of transistors Q1 and Q2. Diodes D3 and D4 provide discharge paths for capacitors C2 and C3.

Transistors Q3 and Q4 control the flow of base current in switching transistors Q1 and Q2. The conduction of control transistors Q3 and Q4 relative to each other is such as to prevent conduction of a switching transistor, Q1 or Q2, before the other switching transistor stage stops conducting. As the voltage across switching transistor Q1 or Q2 increases, control transistor Q3 or Q4 saturates via base current through resistor R3 or R9 of voltage divider resistors R3-R9, thereby driving the respective switching transistor into cutoff.

Figure 7:
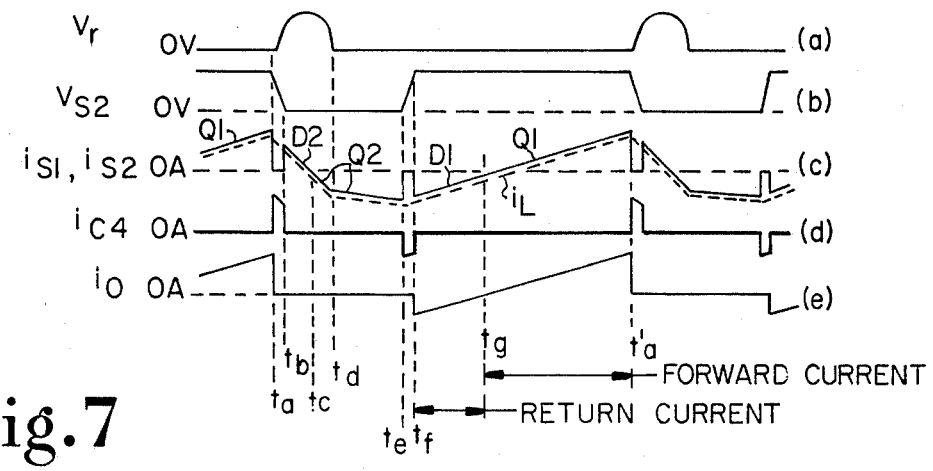

Just prior to time $t_a$ of FIG. 7, a time corresponding to time $t_0$, the beginning of the horizontal retrace interval of FIG. 6, switching transistor Q1 is in saturated conduction. Consequently, control transistor Q3 is in cutoff because essentially no voltage is being developed across resistor R5. Control transistor Q4, however, is in saturated conduction because of the base current being supplied to it through resistor R9, thereby maintaining switching transistor Q2 in cutoff. The voltage $V_{S2}$ across switch S2 and across a parallel capacitor C4 equals the input voltage Vin in magnitude.

Figure 8:
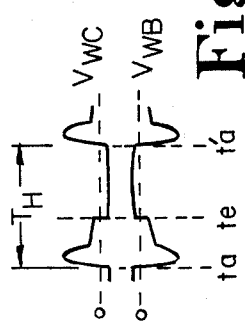

Beginning at time $t_a$ of FIG. 7, the retrace pulse voltage $V_r$ is coupled through flyback transformer T1 to inductor L1, resulting in a negative pulse being developed across control winding WB of inductor L1 and a positive pulse being developed across control winding WC, as illustrated by the waveforms of FIG. 8. The retrace pulse voltages developed across windings WB and WC have superimposed on them a switching waveform produced by operation of switches S1 and S2. The negative pulse voltage developed across control winding WB beginning at time $t_a$ of FIG. 8 makes the undotted terminal of the control winding positive, thereby turning on control transistor Q3 to discharge capacitor C2 and produce a negative base current in switching transistor Q1, thereby initiating the turnoff of that switching transistor.

From time $t_a$ to time $t_b$ of FIG. 7, the current $i_L$ flowing in the main winding WA of inductor L1, previously flowing in transistor Q1, now flows as a current $i_{C4}$ in storage capacitor C4, thereby discharging the capacitor, as illustrated in FIGS. 7c and 7d. At the time $t_b$ the voltage across capacitor C4 has reached zero and is clamped to ground by diode D2 of switch S2. The current $i_L$ now flows through diode D2.

The waveform of FIG. 7b illustrates the slow fall time of the switching voltage $V_{S2}$ caused by the discharge of C4, and the waveforms of FIGS. 7c and 7d illustrate that the entire current $i_L$ flows in capacitor C4 during the switching interval $t_a$-$t_b$ of S1 and S2. The action of capacitor C4 prevents the switching voltage $V_{S2}$ from changing too fast under the inductive current load $i_L$. This action protects switches S1 and S2 from being destroyed by secondary breakdown and also significantly lowers the power dissipation in the switching devices S1 and S2.

The slow rise and fall time of $V_{S2}$ indicates that during the switching intervals $t_a$-$t_b$ and $t_e$-$t_f$ both switching transistors Q1 and Q2 are held in cutoff by transistors Q3 and Q4 which in turn are controlled by the currents through R3 and R9. This arrangement prevents the undesirable simultaneous conduction of transistors Q1 and Q2, which would otherwise have occurred because of the longer turnoff than turn-on time characteristics exhibited by switching transistors.

At time $t_c$ of FIG. 7c, the inductor current $i_L$ becomes negative. After time $t_c$ until time $t_e$, the negative inductor current $i_L$ flows as a positive collector current in the forward biased switching transistor Q2. As illustrated in FIG. 8, between times $t_a$-$t_e$, the voltage across control winding WC is positive, providing the needed forward biasing for switching transistor Q2.

At the controllable instant $t_e$ of FIG. 7, the control voltage waveform 27 of FIG. 2a, developed by the regulator control circuit 26 of FIG. 2a, switches from a low state to a high state. The positive portion of control voltage 27 is applied through diode D7 to turn on control transistor Q4. With transistor Q4 conductive, a reverse biasing voltage developed by capacitor C3 is applied to turn off switching transistor Q2 near time $t_e$ of FIG. 7b. As illustrated in FIGS. 7c and 7d, the current $i_L$ from inductor L1 flows into capacitor C4 to begin charging the capacitor to a positive voltage at the top plate relative to the bottom plate. At time $t_f$ the voltage across capacitor C4 equals the input voltage Vin in magnitude, forward biasing diode D1 of switch S1.

From time $t_f$ to the beginning of the next horizontal retrace interval $t_a'$, switch S1 is conductive and connects input terminal 28 to inductor L1 of resonant circuit 40, to allow a flow of input current $i_0$ from terminal 28 to switch S1, as illustrated in FIG. 7e.

From time $t_f$ to time $t_g$, the zero-crossover instant of both the input current $i_0$ and the inductor current $i_L$, diode D1 conducts a return current back to the input voltage terminal 28. From time $t_g$ to time $t_a$, switching transistor Q1 conducts a forward current from input voltage terminal 28 to resonant circuit 40. Switching transistor Q1 is forward biased for conduction between times $t_e$-$t_a$ by the positive portion of the voltage $V_{WB}$ being developed across control winding WB of inductor L1, as illustrated in FIG. 8. At time $t_a'$, the operating sequence of blocking-oscillator regulator 30 repeats.

The voltage across the main winding WA of inductor L1 relative to the undotted terminal of the winding equals the difference between the switching voltage $V_{S2}$ developed at output terminal 31 and the sum of the retrace pulse voltage $V_{W1}$ and the voltage $V_{C5}$ across capacitor C5 of resonant circuit 40. Therefore, to ensure that proper transistor drive voltages will be developed across both control winding WB and control winding WC, one of the control windings has a greater number of turns than the other.

Figure 3:
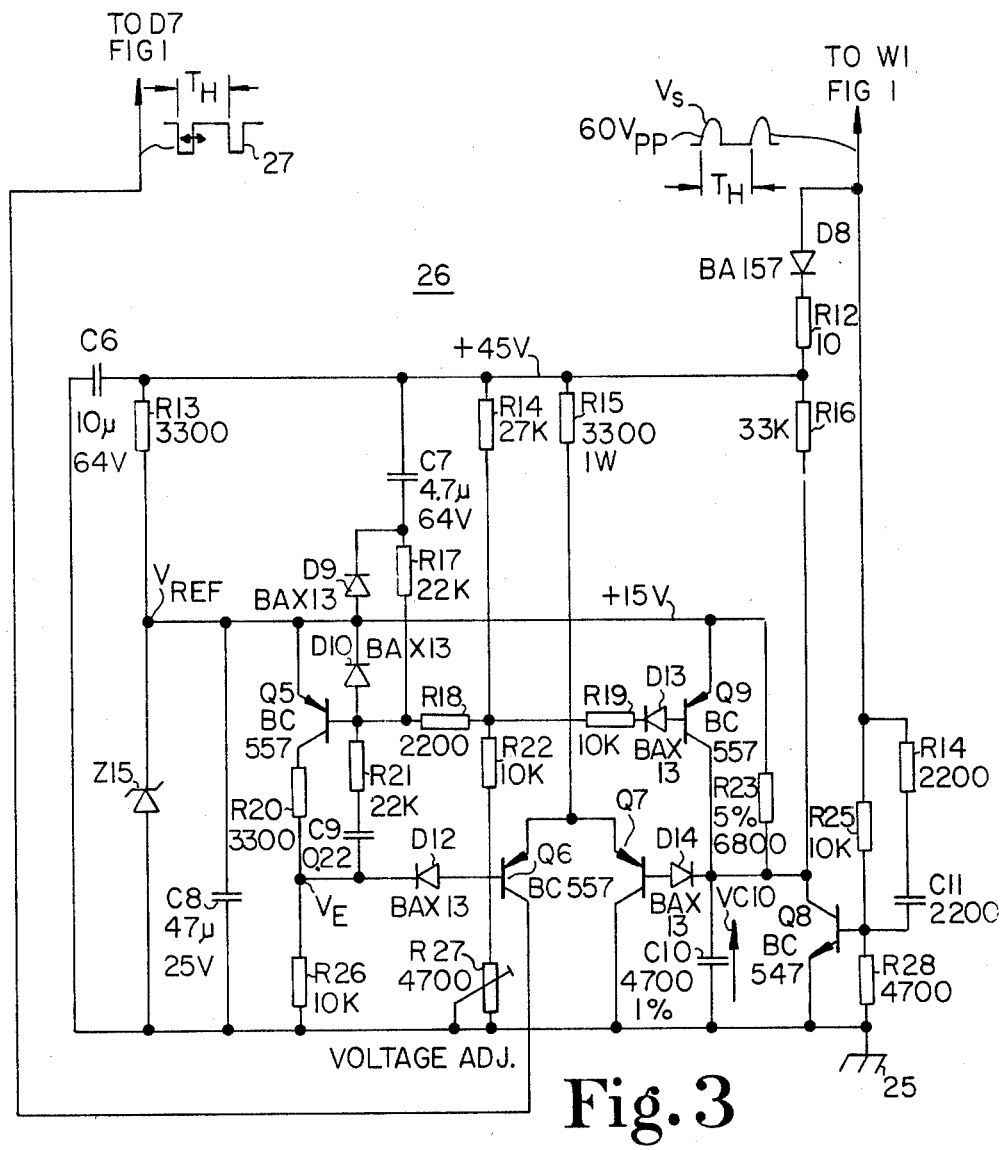
FIG. 3 illustrates an embodiment of a regulator control circuit for the circuit of FIGS. 2a and 2b.

An embodiment of regulator control circuit 26 is illustrated in FIG. 3. A +45 volt DC supply rail voltage for regulator control circuit 26 is developed by rectification of the retrace pulses $V_s$ obtained from the tap terminal on flyback transformer winding W1 of FIG. 2a. A zener diode Z15 provides a reference voltage $V_{ref}$, which also serves as a regulated 15 volt supply rail voltage. The reference voltage $V_{ref}$ is applied to the emitter of a comparator transistor Q5. A portion of the rectified retrace voltage $V_s$ is applied to the base of the transistor through resistors R14 and R18. The comparison produces an error voltage $V_E$ at the junction of resistors R20 and R26 of a voltage divider coupled to the collector of comparator transistor Q5. This error voltage is representative of the deviation of the amplitude of the horizontal retrace pulse $V_r$ from the desired amplitude.

The error voltage $V_E$ is applied to the base of transistor Q6 of a differential amplifier comprising transistor Q6 and a transistor Q7. The base of transistor Q7 is connected to a horizontal ramp generating capacitor C10. Capacitor C10 charges through the resistors R23 and R16 during each horizontal trace period. The horizontal retrace pulse voltage $V_s$ is applied to the base of a synchronizing transistor Q8 which keeps capacitor C8 discharged during the retrace interval.

The pulse-width modulated control voltage 27 is developed at the collector of differential amplifier transistor Q6 and controls, by means of transistor Q4 of FIG. 2a, the conduction of switching transistor Q2 of blocking oscillator-regulator 30.

Figure 4:
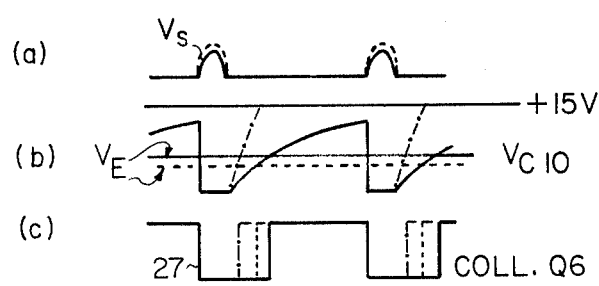
FIG. 4 illustrates waveforms associated with the operation of the regulator control circuit of FIG. 3.

A shift of the error voltage $V_E$ results in a change of the conduction time of differential amplifier transistor Q6 and consequently a change of the duty cycle of switching transistor Q2 and blocking oscillator 30. An increase in the amplitude of retrace pulse voltage $V_s$, as illustrated by the greater amplitude dashed-line waveform of FIG. 4a, due, for example, to decreased loading by load circuits 32 of FIG. 2b, or due to an increase in the mains developed input voltage Vin, produces a decreased error voltage $V_E$ as illustrated by the dashed-line waveform of FIG. 4b. The horizontal ramp voltage $V_{C10}$ produced by capacitor C10 intersects the error voltage $V_E$ earlier, turning on transistor Q6 earlier, as illustrated by the dashed-line waveform of FIG. 4c. The earlier turn-on of transistor Q6 produces an earlier turn-off of switching transistor Q2 and in turn a higher average voltage across capacitor C5 and a higher amount of return current through diode D1. Controllable switch S1 therefore becomes conductive earlier within the trace interval, but because of the higher average voltage across capacitor C5, the current $i_L$ increases at a slower rate at the decreased loading level or at the increased input voltage Vin.

The control circuit 26 generates a control waveform 27 which has a negative-going edge at the beginning of retrace when transistor Q8 begins to discharge the ramp capacitor C10 and a positive-going edge just after the end of retrace at very low loading levels by circuits 32. As the loading increases, the positive-going edge moves toward the center of trace where maximum power transfer is reached between primary and secondaries of transformer T1. This point is reached when the conduction time of switches S1 and S2 are substantially equal.

Should switch S2 conduct longer than switch S1, operation of blocking oscillator 30 becomes instable. Therefore, regulator circuit 26 provides for range limiting when load circuits 32 draw excessive current. The error voltage $V_E$ cannot increase more than that determined by the 15 volt supply rail voltage and by the voltage divider action of resistors R20 and R26. The error voltage $V_E$ therefore intersects the ramp voltage just before the center of trace. Because of the limited control range, any further, excessive loading will decrease the +45V supply rail in magnitude. This decrease in magnitude is coupled to the base of a limiter transistor Q9 by way of resistors R14 and R19. Transistor Q9 is driven into saturated conduction providing additional charging current for ramp capacitor C10. As illustrated by the dotted-dashed-line waveform of FIG. 4b, the ramp voltage $V_{C10}$ now rises much faster than during normal regulator control circuit operation, resulting in a much earlier turn-on of differential amplifier transistor Q6, as illustrated by the dotted-dashed waveform of FIG. 4c. The substantially shortened conduction time of transistor Q6 produces a similarly shortened conduction time of switching transistor Q2 and a consequent substantial reduction in the net power transfer from the unregulated input voltage source to the retrace resonant circuit 50.

As previously mentioned, to sustain free-running operation of blocking oscillator 30, during start-up and short-circuit operating conditions, control windings WB and WC of inductor L1 provide the regenerative, forward biasing voltages to the bases of switching transistors Q1 and Q2. FIGS. 5a and 5b, previously referred to, illustrate the switching waveform $V_{S2}$ and the current waveform $i_L$, during free-running operation. Immediately prior to time $T_1$ of FIGS. 5a and 5b, the control winding voltage $V_{WB}$, not illustrated, is positive, providing the forward biasing voltage needed to keep switching transistor Q1 conductive. The other control winding voltage $V_{WC}$, also not illustrated, is negative and maintains switching transistor Q2 in the cutoff state.

Between times $T_1$-$T_3$, the control voltage $V_{WB}$ is negative and the control voltage $V_{WC}$ is positive, producing a cutoff condition in switching transistor Q2. Between times $T_1$-$T_2$, the inductor current $i_L$ first flows in capacitor C4 and then in diode C2, and between times $T_2$-$T_3$, the inductor current $i_L$ flows in switching transistor Q2.

Between times $T_3$-$T_1'$, control voltage $V_{WB}$ is positive and control voltage $V_{WC}$ is negative, producing a forward biasing condition for switching transistor Q1 and a cutoff condition for switching transistor Q2. Between times $T_3$-$T_4$, the inductor current $i_L$ first flows in capacitor C4 and then in diode D1W1; and between times $T_4$-$T_1'$, the current flows in switching transistor Q1. The free-running operating sequence repeats beginning at time $T_1'$.

In synchronized operation, switch S1 is turned off only upon the occurrence of the retrace pulse voltage, and switch S2 is turned off only upon the occurrence of the positive-going edge of control voltage 27. Therefore, the free-running conduction times of switches S1 and S2 must each be equal to or longer than the horizontal trace interval, to prevent erroneous switching during synchronized operation.

As previously mentioned, upon initial closure of on/off switch 23, blocking oscillator 30 commences oscillation in a free-running mode. During the conduction time of switching transistor Q1, energy transfers to the retrace resonant circuit 50, which then begins to ring at the horizontal retrace frequency. The ringing voltage in retrace circuit 50 is clamped to ground by the simultaneous conduction of damper diode $D_D$ and the diode formed by the base collector junction of horizontal output transistor Q10. This clamping action results in the charging of capacitors C12 and C14 and in the storage of energy therein.

As the start-up interval elapses, the ringing voltage in resonant retrace circuit 50 increases in magnitude. The ringing voltage is transformer coupled to regulator control circuit 26 by way of the tap terminal on flyback transformer winding W1. This voltage is rectified by diode D8 in FIG. 3. The ringing voltage is also coupled to the +25 volt supply rail by way of flyback transformer winding W4 and rectifier diode D17. When the +45 volt and +25 volt supply rail voltages increase to about one third of their normal, steady-state operating values, horizontal oscillator 34 and regulator control circuit 26 begin to operate, producing horizontal rate switching signals for horizontal output transistor Q10 of deflection generator 60 and control pulses to switching transistor Q2 of blocking oscillator 30.

FIGS. 9–12 illustrate selected voltage and current waveforms for the regulated deflection circuit of FIGS. 2a and 2b at selected sequential instants during the start-up interval, from the instant at which the input voltage Vin has attained 50% of its nominal steady-state value in FIG. 9 to the instant when the input voltage Vin has achieved 100% of its steady-state value in FIG. 12.

When the voltage Vin is less than 50% of its steady-state value, the free-running mode of operation of blocking oscillator 30 is not being influenced by the ringing of retrace resonant circuit 50. At 50% of nominal input voltage Vin, the retrace circuit ringing voltage enables the turnoff time of regulator switching transistor Q1 to be synchronized to the second ringing voltage pulse, as illustrated in FIG. 9c, resulting in blocking oscillator operation at a frequency higher than the free-running or short-circuit frequency.

At about 55% of nominal input voltage Vin, blocking oscillator 30 is fully synchronized with horizontal deflection as illustrated by FIGS. 10a and 10c. Because of the still low input voltage Vin, adequate power cannot yet be transferred from resonant circuit 40 to the retrace resonant circuit 50 and the load circuits 32. Because of the low amplitude retrace pulse voltage $V_r$ being developed, the regulator control circuit 26 operates in the partial overload mode of operation with power limiting control transistor Q9 of FIG. 3 in saturation conduction. Conduction of transistor Q9 produces a sharply upward sloping synchronizing ramp voltage $V_{C10}$, as illustrated in FIG. 10d, and produces an early turnoff of switching transistor Q2.

At 60% of nominal input voltage Vin, the power limiting control transistor Q9 is disabled, as illustrated by the shallower slope ramp voltage $V_{C10}$ of FIG. 11d. The retrace pulse voltage $V_r$ has increased to near nominal value, as illustrated in FIG. 11a. The transferred power is near maximum as indicated by the near equal conduction time of switching transistors Q1 and Q2, as indicated by the near 50% duty cycle of the voltage $V_{S2}$ of FIG. 11c.

Nominal or 100% input voltage Vin is illustrated in FIG. 12 for a mains power input of 60 watts, illustratively. In contrast to the situation in FIGS. 9 and 11, the error voltage $V_E$ of FIG. 12d is lower at 100% input voltage Vin, resulting in longer conduction of switching transistor Q1 and shorter conduction of switching transistor Q2.

As previously mentioned, during start-up, a ringing voltage is developed by retrace resonant circuit 50. During this interval, the horizontal output transistor Q10 may be damaged if driven into saturated conduction at a time when the ringing voltage appears at the transistor collector electrode. To prevent such a situation from occurring, flyback transformer winding W3 is connected via resistor R35 and diode D16 to the base of horizontal driver transistor Q11. Any positive voltage developed across winding W3, such as during start-up ringing, forward biases horizontal driver transistor Q11 into saturated conduction, keeping horizontal output transistor Q10 in a cutoff state. Winding W3, resistor R35 and diode D16 also protect horizontal output transistor Q10 during fault conditions, such as during malfunction of horizontal oscillator 34 and during picture tube arcing.

Figure 13:
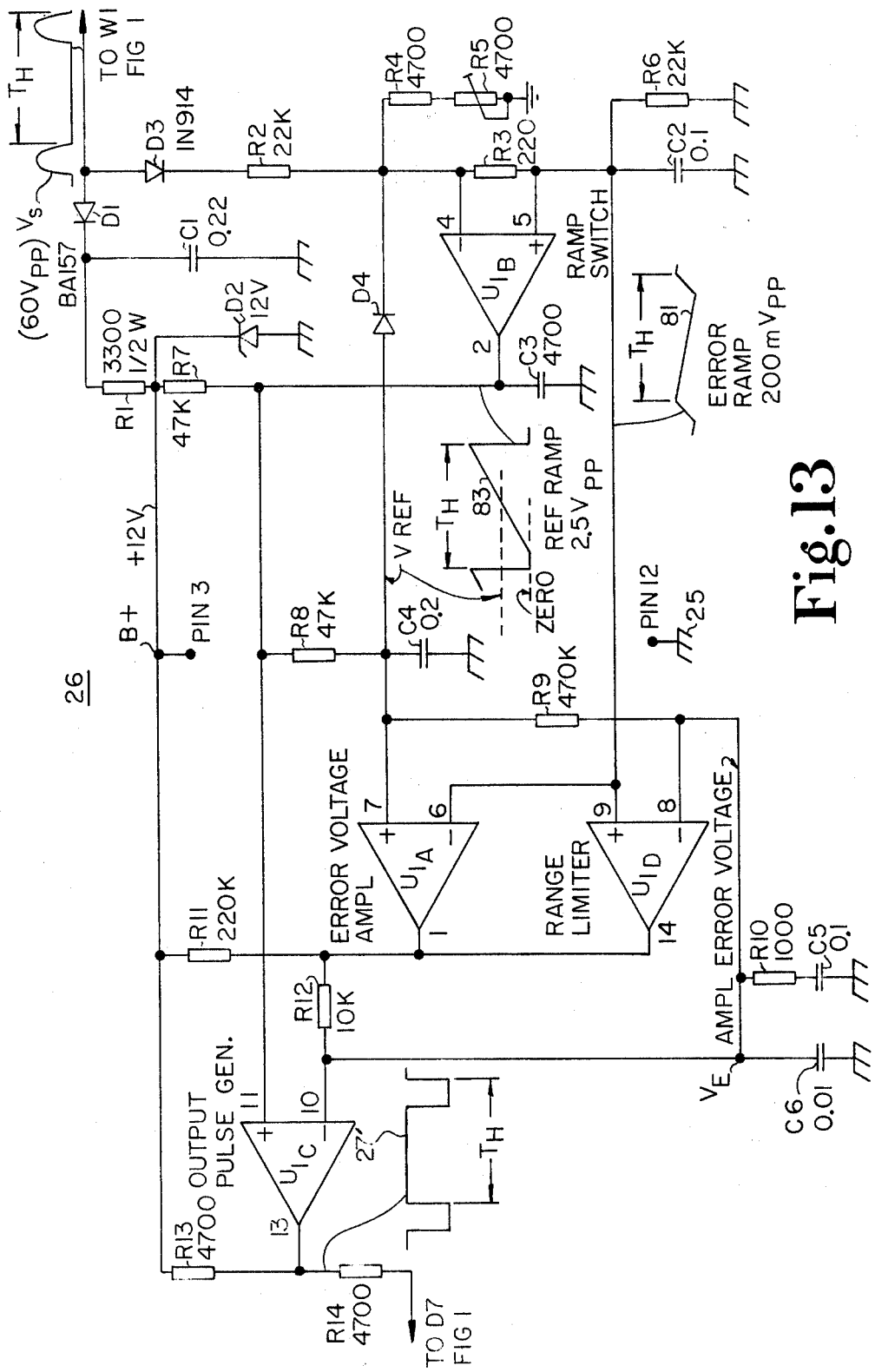
FIG. 13 illustrates another embodiment of a regulator control circuit for the circuit of FIGS. 2a and 2b.

FIG. 13 illustrates another embodiment of regulator control circuit 26 that uses a quad-comparator integrated circuit, U1A through U1D, such as an RCA CA339 manufactured by RCA Corporation, Somerville, N.J., USA. A difference between the regulator control circuits of FIGS. 3 and 13 is that the one of FIG. 3 responds to changes in the peak amplitude of the retrace pulse voltage $V_s$, whereas the one of FIG. 13 responds to the average retrace voltage amplitude.

Figure 14:
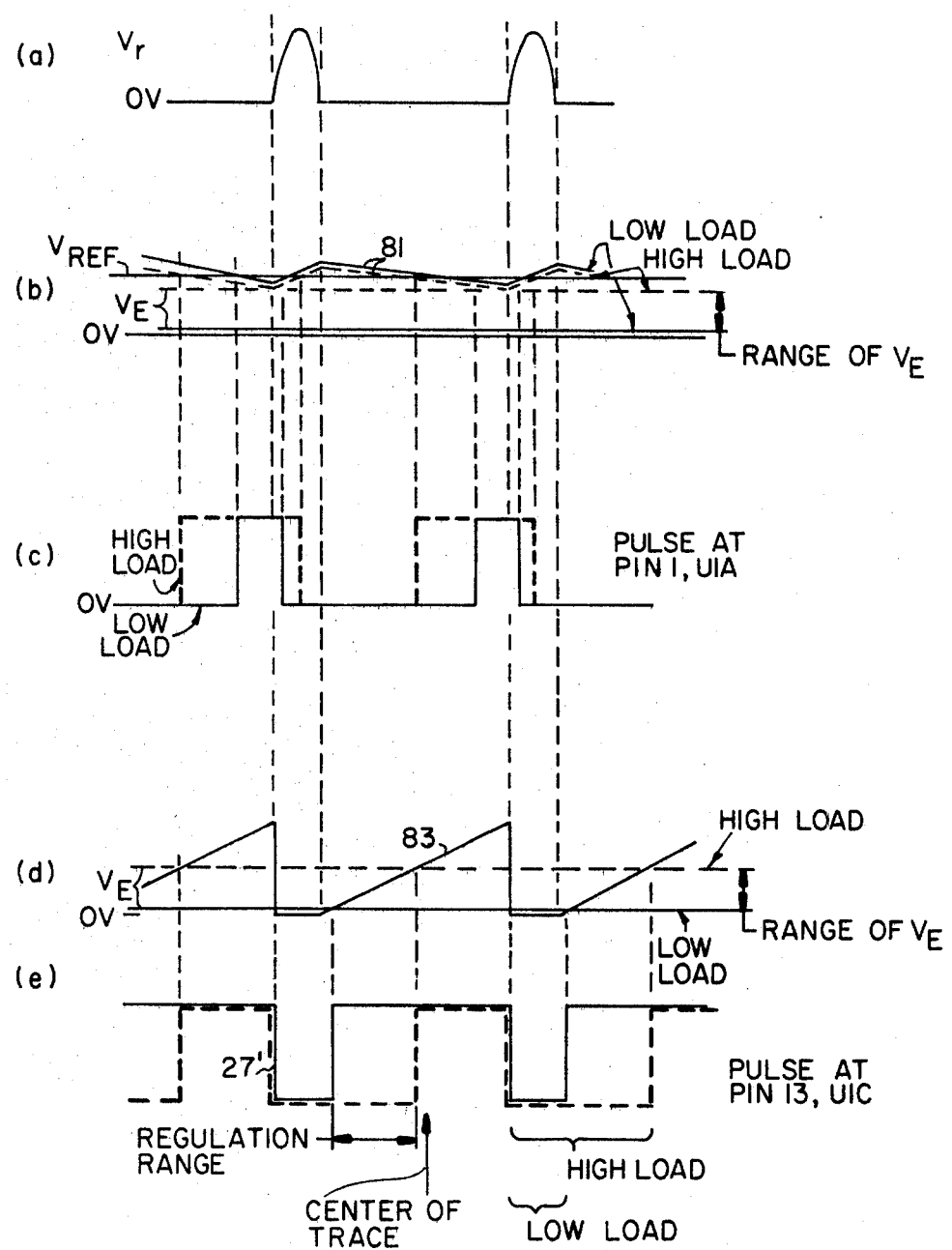
FIGS. 14 and 15 illustrate waveforms associated with the operation of the circuit of FIG. 13.

Operation of the regulator control circuit 26 illustrated in FIG. 13 is as follows. Horizontal retrace pulses, illustrated in FIG. 14a, are integrated via diode D3, resistors R2–R6, and capacitor C2. Across capacitor C2 appears an error ramp voltage 81. Error ramp voltage 81 is compared with a reference voltage level $V_{REF}$ in an error voltage amplifier comparator U1A. The reference voltage level $V_{REF}$ is obtained through integration, by way of a resistor R8 and a capacitor C4, of a reference ramp voltage 83 which is produced by a resistor R7, a capacitor C3 and a ramp switch comparator U1B to discharge capacitor C3.

FIG. 14b illustrates the signal waveforms at pins 6 and 7 of error voltage amplifier U1A for high and low power loading of flyback transformer T1 of FIGS. 2a and 2b. FIG. 14c illustrates the output pulse at pin 1 of amplifier U1A at both high and low load.

An amplified error voltage $V_E$ is obtained by integration of the output pulses of error voltage amplifier U1A by way of resistor R12 and capacitor C6. The amplified error voltage $V_E$ is then compared with the reference ramp voltage 83 in an output pulse generator comparator U1C as illustrated in FIG. 14d. This comparison produces a pulse-width modulated control pulse 27' of FIG. 13 or pulse 27 of FIG. 2a to control the conduction of switching transistor Q2.

In order to avoid unstable operation of blocking oscillator 30, regulator control circuit 26 of FIG. 13 provides control range limiting such that the occurrence of the positive-going edge of control pulse 27' cannot be delayed beyond the center of the trace interval of the horizontal deflection cycle. Comparator U1D of FIG. 13 provides this limiting action. Comparator U1D compares the error ramp voltage 81 to the amplified error voltage $V_E$. During normal operation the range of amplified error voltages $V_E$ is below the range of error ramp voltages 81, as illustrated in FIG. 14b, resulting in comparator U1D being in a cutoff condition throughout this range.

Figure 15:
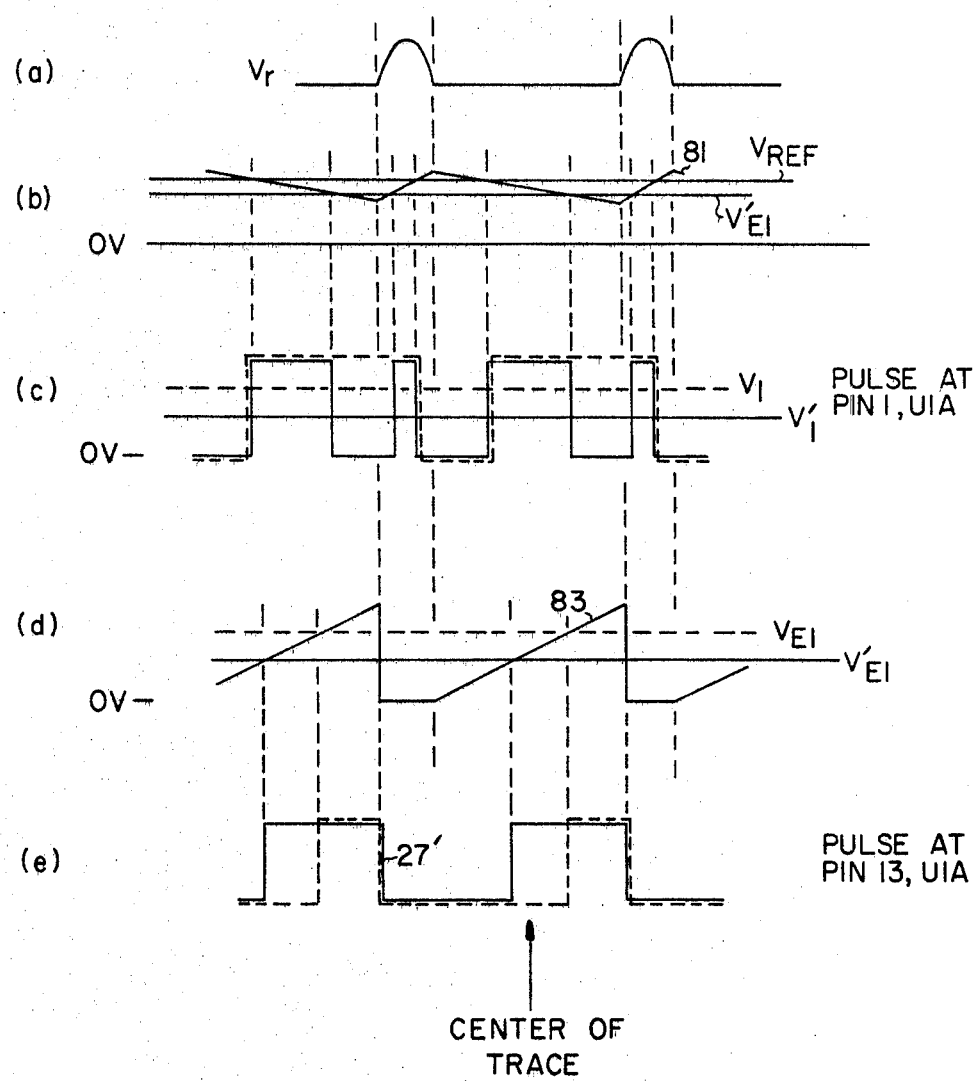

During an overload condition wherein the amplitude of the retrace pulse voltages $V_r$ and $V_s$ are substantially reduced, but not eliminated, the error ramp voltage 81 still intersects the reference voltage level, $V_{REF}$, as illustrated in FIG. 15b. However, had no provision been made for including the range limiter comparator into the circuit of FIG. 13, the output pulse produced at pin 1 of error voltage amplifier U1A would have been the dashed-line waveform of FIG. 15c. This pulse would have been in the high state for a relatively long duration within a deflection cycle and would have produced a relatively large magnitude error voltage $V_{E1}$.

The comparison, illustrated in FIG. 15d, by output pulse generator U1C of the voltage $V_{E1}$ with reference ramp 83 would have produced the dashed-line control pulse 27' of FIG. 15e. The positive-going edge of dashed-line pulse 27' would have been delayed beyond the center of horizontal trace, resulting in the transfer of excessive power to retrace resonant circuit 50 and load circuits 32 of FIG. 2b during the overload condition.

To prevent the occurrence of such a situation, the error voltage $V_E$ is applied to the negative input terminal of range limiter U1D, while the error ramp voltage 81 is applied to the positive input terminal. During an overload condition, the error voltage is of sufficient magnitude $V_{E1}'$ of FIG. 15b to intersect the error ramp voltage 81, producing a low output level at pin 14 of U1D whenever the error voltage $V_{E1}'$ is above the error ramp voltage 81.

The outputs of U1A and U1D are logically combined to produce the solid-line pulse voltage of FIG. 15c. This voltage has an average value $V_1'$ much less than the average value $V_1$ of the dashed-line pulse of FIG. 14c, producing the lower error voltage magnitude $V_{E1}'$, previously mentioned.

When the lower error voltage $V_{E1}'$ is compared to the reference ramp 83, illustrated in FIG. 15d, the solid-line control pulse waveform 27' of FIG. 15e is produced, having a positive-going edge that occurs just before the center of trace, as is required to provide a limitation of control range during an overload condition. A still greater increase in loading produces a longer duration of the low state of the voltage waveform pulse at pin 1 of U1A. As a result, the positive-going edge of waveform 27' is shifted farther back toward the beginning of the trace interval.

A slight hysteresis to the operation of range limiter U1D is provided by connecting pin 7 of error voltage amplifier U1A to pin 8 of range limiter U1D through a resistor R9. This hysteresis stabilizes operation of range limiter U1D.

If the retrace pulse voltages $V_r$ and $V_s$ collapse, as may occur during a short-circuit, or during a very heavy overload condition, or during turnoff of the television receiver when on/off switch 23 of FIG. 2a is opened, a limiter diode D4 of FIG. 13 conducts to rapidly lower the level of the integrated reference voltage $V_{REF}$. Lowering the voltage level $V_{REF}$ protects the television receiver from voltage overshoot stresses.

The gain of the error voltage amplifier U1A depends upon the amplitude of error ramp voltage 81—the smaller the amplitude the higher the gain. Variable resistor R5 shifts the DC level of error ramp 81 and therefore provides adjustment control of the amplitude of the retrace pulse voltage $V_r$.

A description of selected magnetic components that may be used in the circuit of FIGS. 2a and 2b is as follows:

L1: Core, Philips U-U 25/20/13, Material 3 C 8 or similar;
  Air gap 1 mm each limb;
  WA 168 turns, 3 mH;
  WB 7 turns;
  WC 10 turns;
  All windings, 0.6 mm diameter copper wire.
T1: Core, Siemens U 47, Material N 27 or similar;
  Air gap 0.1 mm each limb,
  10 volts/turn;
  W1 120 turns, tap at 6 turns;
  W2 92 turns;
  W3 6 turns;
  W4 21 turns;
  All windings, 0.5 mm diameter copper wire.
  Isolation between primary and secondaries: 4000 volts.

What is claimed is:

1. A deflection circuit comprising:
  a deflection winding;
  a deflection generator coupled to said deflection winding for generating scanning current in said deflection winding during a deflection cycle, said deflection generator including a retrace capacitance coupled to said deflection winding for forming a retrace resonant circuit therewith to produce a retrace pulse voltage during a retrace interval of said deflection cycle;
  an inductance;
  a second capacitance coupled to said inductance for forming a second resonant circuit therewith, said second resonant circuit being coupled to said deflection generator;
  a source of energy; and
  switching means coupled to said source and to said second resonant circuit in a self-oscillating configuration, said switching means being responsive to a deflection rate switching signal for storing a controllable amount of energy from said source in said second resonant circuit, said retrace pulse voltage being applied to said second resonant circuit to provide for the transfer of energy between said second and retrace resonant circuits,
  said switching means in the absence of said deflection rate switching signal undergoing free-running oscillation.

2. A deflection circuit according to claim 1 wherein said switching means is coupled to said source and to said second resonant circuit in a blocking oscillator configuration.

3. A deflection circuit according to claim 2 wherein the frequency of said free-running oscillation is lower than the frequency of said deflection cycle.

4. A deflection circuit according to claims 1 or 2 wherein said switching means includes first and second switching devices coupled to said inductance in a push-pull relationship.

5. A deflection circuit according to claim 4 wherein the frequency of free-running oscillation is such that during said free-running oscillation, each of said first and second switching devices conducts for a duration that is longer than the duration of said trace interval.

6. A deflection circuit according to claim 5 wherein the amount of energy stored in said second resonant circuit at the end of said trace interval remains substantially unchanged as said controllable instant varies.

7. A deflection circuit according to claim 1 wherein said switching arrangement includes a first controllable switching device coupled to said source and to said second resonant circuit, a second controllable switching device coupled to said second resonant circuit, and a control circuit responsive to said deflection rate signal for changing the conductive state of said first switching device at a controllable instant within the trace interval of said deflection cycle and of said second switching device within said retrace interval.

8. A deflection circuit according to claim 7 wherein said control circuit is responsive to a deflection circuit energy level to vary said controllable instant as said energy level varies.

9. A deflection circuit according to claim 8 wherein the amount of energy stored in said second resonant circuit at the end of said trace interval remains substantially unchanged as said controllable instant varies.

10. A deflection circuit according to claims 1, 7 or 9 wherein said second resonant circuit is coupled to said deflection generator by way of a transformer, a first winding thereof being coupled to said second resonant circuit, a second winding thereof being coupled to said retrace resonant circuit.

11. A deflection circuit according to claim 7 wherein said first and second controllable switching devices include first and second bidirectionally conductive main current paths, respectively, the two main current paths being coupled in series across said source of energy, said inductance and said second capacitance being coupled in series across one of said two main current paths.

12. A deflection circuit according to claim 11 wherein said second resonant circuit is coupled to said deflection generator by way of a flyback transformer, a first winding thereof being coupled in series with said inductance and second capacitance across said one main current path, a second winding thereof being coupled to said retrace resonant circuit.

13. A deflection circuit according to claims 7 or 9 wherein said inductance includes a main winding coupled to a main current path of each of said two controllable switches and two control windings, each coupled respectively to a control terminal of a respective switch.

14. A deflection circuit according to claim 9 wherein said control circuit includes means for detecting an overload condition and means for establishing said controllable instant at a point within the deflection cycle where the amount of energy transferred by said second resonant circuit is substantially reduced.

15. A deflection circuit according to claim 1 wherein said switching arrangement includes first and second controllable switches having their main current paths coupled to said inductance and control means for alternately turning off said two switches, said control means including means for maintaining the main current path of a given switch nonconductive until after conduction is substantially cut off in the main current path of the other switch.

16. A deflection circuit according to claim 15 wherein said control means includes a capacitance coupled to said inductance for providing a path for current to flow from said inductance, other than through a main path of either of the two controllable switches, during the time that the conduction in the main current path of either of the two switches is being cut off.

17. A deflection circuit according to claim 1 wherein said deflection generator includes a controllable output device coupled to said deflection winding, a deflection oscillator coupled to a control terminal of said output device for switching said output device on within the trace interval of said deflection cycle and for switching said output device off to initiate said retrace interval, means for detecting oscillation of said retrace resonant circuit, and means coupled to said deflection oscillator and to said detecting means for maintaining said output device off when oscillation of said retrace resonant circuit is detected.

18. A deflection circuit according to claim 17 wherein said second resonant circuit is coupled to said deflection generator by way of a transformer, a first winding thereof being coupled to said second resonant circuit, a second winding thereof being coupled to said retrace resonant circuit, a third winding thereof comprising said detecting means.

19. A deflection circuit, comprising:
a deflection winding;
a deflection generator coupled to said deflection winding for generating scanning current in said deflection winding during a deflection cycle, said deflection generator including a retrace capacitance coupled to said deflection winding for forming a retrace resonant circuit therewith to develop a retrace pulse voltage during a retrace interval of said deflection cycle;
a second resonant circuit including an inductance, said retrace pulse applied voltage being applied thereto;
a source of input voltage;
first and scond controllable switches coupled to said second resonant circuit, each switch becoming conductive after the other switch becomes substantially nonconductive, said first switch when conductive coupling said source of input voltage to said second resonant circuit to enable the transfer of energy between said source and said second resonant circuit and when nonconductive decoupling said source from said second resonant circuit, said second switch when conductive enabling the transfer of energy between said second resonant circuit and said retrace resonant circuit.

20. A deflection circuit according to claim 19 wherein said first and second switches are coupled to said inductance in a push-pull relationship.

21. A deflection circuit according to claims 19 or 20 including control means coupled to control terminals of said first and second switches and responsive to a deflection circuit energy level and a deflection rate control signal for turning off said second switch at an instant within the trace interval of said deflection cycle that varies as said energy level varies to provide regulation thereof and for turning off said first switch near the beginning of the retrace interval.

22. A deflection circuit according to claim 21 wherein said two switches are bidirectionally conductive.

23. A deflection circuit according to claim 21 wherein said inductance includes a main winding coupled to output terminals of said first and second switches and first and second control windings coupled to the respective control terminals of said first and second switches to provide regenerative feedback of the voltages at said output terminals.

24. A deflection circuit according to claim 23 wherein, in the absence of said deflection rate control signal, said regenerative feedback produces oscillation of the voltages at said output terminals at a frequency lower than the frequency of said deflection cycle.

25. A deflection circuit according to claim 24 wherein said deflection generator includes a controllable output device coupled to said deflection winding, a deflection oscillator coupled to a control terminal of said output device for switching said output device on within the trace interval of said deflection cycle and for switching said output device off to initiate said retrace interval, means for detecting oscillation of said retrace resonant circuit, and means coupled to said deflection oscillator and to said detecting means for maintaining said output device off when oscillation of said retrace resonant circuit is detected.

26. A deflection circuit according to claim 21 wherein said control means includes means for detecting an overload condition within said deflection circuit, means responsive to the detected overload condition for establishing the instant within the trace interval that said second switch is turned off at an instant that provides substantially reduced energy transfer to said retrace resonant circuit.

27. A deflection circuit according to claims 19 or 20 wherein said second resonant circuit includes a capacitance, said first switch when conductive applying said input voltage across the series arrangement of said second resonant circuit capacitance and said inductance.

28. A deflection circuit according to claim 27 including a flyback transformer having a first winding coupled to said second switch and a second winding coupled to said retrace resonant circuit for developing a retrace pulse voltage across said flyback tranformer first winding, said second switch when conductive applying said retrace pulse voltage across said series arrangement.

29. A deflection circuit, comprising:
means for developing an input voltage between first and second input terminals;
first and second controllable switches, each having a main current path and a control terminal for controlling conduction therein, the two main current paths being coupled together at an output terminal and further being coupled in a series arrangement between said first and second input terminals;
a first resonant circuit including an inductance coupled between said output terminal and one of said first and second input terminals;
a deflection winding;
a deflection generator coupled to said deflection winding for generating scanning current in said deflection winding during a deflection cycle and further including a retrace resonant circuit that directly applies a retrace pulse voltage to said first resonant circuit;
a control circuit coupled to the control terminals of both switches for alternately turning off conduction in the main paths of said two switches during a deflection cycle to store energy in said inductance that is transferred to said retrace resonant circuit during application of said retrace pulse voltage to said first resonant circuit; and
a capacitance coupled between said output terminal and one of said first and second input terminals to accept the flow of current from said inductance when conduction in the main path of one switch is being turned off and prior to the commencement of conduction in the the main path of the other switch to avoid any significant simultaneous conduction in the main paths of both switches.

30. A deflection circuit according to claim 29 including a voltage divider having first and second end terminals coupled respectively to said first and second input terminals, having a third terminal intermediate the two voltage divider end terminals coupled to said output terminal, having a fourth terminal intermediate one of said voltage divider end terminals and said voltage divider third terminal coupled to the control terminal of one of said switches, and having a fifth terminal intermediate the other one of said voltage divider end terminals and said voltage divider third terminal coupled to the control terminal of the other one of said switches.

31. A deflection circuit according to claim 29 wherein said deflection generator includes a retrace capacitance coupled to said deflection winding for forming a retrace resonant circuit therwith to generate a retrace pulse voltage during a retrace interval of said deflection cycle, said retrace resonant circuit being coupled to said first resonant circuit during the retrace interval to transfer energy therebetween.

32. A deflection circuit according to claim 31 wherein the first resonant circuit is coupled to said deflection generator by way of a flyback transformer, a first winding thereof being coupled to said first resonant circuit, a second winding thereof being coupled to said retrace resonant circuit.

33. A deflection circuit according to claim 31 wherein said control circuit includes means for regneratively feeding back the voltage at said output terminal to produce free-running oscillation of said switching means in the absence of retrace pulse generation.

34. A deflection circuit according to claim 33 wherein said first resonant circuit includes a capacitance coupled in series with said inductance between said output terminal and said one input terminal.

35. A deflection circuit, comprising:
a deflection winding;
a deflection generator coupled to said deflection winding for generating scanning current in said deflection winding during a deflection cycle, said deflection generator including a retrace capacitance coupled to said deflection winding for forming a retrace resonant circuit therewith to produce a retrace pulse voltge during a retrace interval of said deflection cycle;
an inductance coupled to said deflection generator;
a source of energy;
switching means coupled to said source and to said inductance and responsive to a deflection rate switching signal for storing a controllable amount of energy from said source in said inductance, said retrace pulse voltage being applied to said inductance to provide for the transfer of energy between said inductance and said retrace resonant circuit; and
means for regeneratively feeding back the output of said switching means to produce free-running oscillation thereof in the absence of said deflection rate switching signal.

* * * * *

UNITED STATES PATENT AND TRADEMARK OFFICE
CERTIFICATE OF CORRECTION

PATENT NO. : 4,484,113

DATED : November 20, 1984

INVENTOR(S) : Peter Eduard Haferl

It is certified that error appears in the above-identified patent and that said Letters Patent is hereby corrected as shown below:

Column 8, line 45 that portion reading "$t_a$" should read --$t_a'$--. Column 8, line 49 that portion reading "$t_a$" should read --$t_a'$--. Column 10, line 45 that portion reading "D1W1" should read --D1--. Column 16, line 19 that portion reading "pulse applied voltage" should read --pulse voltage--.

Signed and Sealed this

Seventh Day of May 1985

[SEAL]

Attest:

DONALD J. QUIGG

Attesting Officer

Acting Commissioner of Patents and Trademarks